(12) United States Patent
Nakagawa

(10) Patent No.: US 7,458,149 B2
(45) Date of Patent: Dec. 2, 2008

(54) PRINTED CIRCUIT BOARD AND METHOD OF MANUFACTURING THE SAME

(75) Inventor: Takashi Nakagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 311 days.

(21) Appl. No.: 11/028,040

(22) Filed: Jan. 4, 2005

(65) Prior Publication Data

US 2006/0081476 A1    Apr. 20, 2006

(30) Foreign Application Priority Data

Oct. 19, 2004    (JP)    ............................. 2004-303736

(51) Int. Cl.
*H05K 3/02* (2006.01)
*H05K 3/10* (2006.01)

(52) U.S. Cl. ............................. 29/846; 29/852; 174/261

(58) Field of Classification Search .................. 29/846, 29/847, 848, 849, 852, 853; 174/261
See application file for complete search history.

(56) References Cited

U.S. PATENT DOCUMENTS 6,184,476 B1 * 2/2001 Takahashi et al. ........... 174/261

7,226,807 B2 * 6/2007 Okazawa et al. ............. 438/106

FOREIGN PATENT DOCUMENTS

| JP | 2002-026172 | 1/2002 |
|---|---|---|
| JP | 2003-188496 | 7/2003 |

* cited by examiner

*Primary Examiner*—Jeremy C Norris
(74) *Attorney, Agent, or Firm*—Staas & Halsey LLP

(57) ABSTRACT

A wiring pattern can be formed with a high density on a substrate as a highly reliable printed circuit board. A method of manufacturing a printed circuit board includes a step of forming a conductive layer, which is to be used as a plating power supplying layer, on a substrate, a step of forming a first mask pattern for forming a predetermined wiring pattern on a surface of the conductive layer, carrying out electroplating with the conductive layer as the plating power supplying layer to form a conductive part on the conductive layer, and then removing the first mask pattern, and a step of forming a second mask pattern that exposes required parts of the conductive part on the substrate, on which the conductive part has been formed on the conductive layer, carrying out electroplating with the conductive layer as the plating power supplying layer to form protective plating on exposed parts of the conductive part, and then removing the second mask pattern.

7 Claims, 4 Drawing Sheets

PRINTED CIRCUIT BOARD AND METHOD OF MANUFACTURING THE SAME

BRIEF DESCRIPTION OF THE DRAWINGS

1. Field of the Invention

The present invention relates to a printed circuit board and a method of manufacturing the same, and in more detail to a printed circuit board and a method of manufacturing the same where protective plating, such as gold plating, is applied as a surface treatment of a wiring pattern formed on the printed circuit board.

2. Related Art

Figure 1:
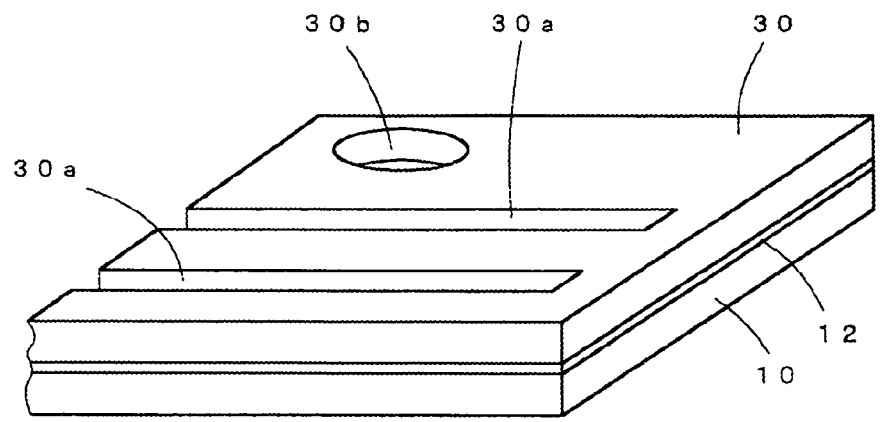

The so-called "subtract method" has often been used to form wiring patterns on printed circuit boards. However, since there is a tendency for the wiring patterns of printed circuit boards to become finer, printed circuit boards are now being manufactured using a semi-additive method that can form finer wiring patterns (see Patent Documents 1 and 2).

FIGS. 10A to 10E show a method of forming a wiring pattern using a semi-additive method. In this semi-additive method, a conductive layer 12 composed of electroless copper plating or the like is formed on the entire surface of a substrate 10 (see FIG. 10A) and a resist 14 is patterned by photolithography to expose only parts that will become the wiring pattern (see FIG. 10B). Next, copper electroplating with the conductive layer 12 as a plating power supplying layer is carried out to form a copper plating layer 16 as a conductive part for the wiring pattern, and then a nickel plating layer 18 and a gold plating layer 20 are formed on the surface of the copper plating layer 16 by electroplating (see FIG. 10C). Next, the resist 14 is removed (see FIG. 10D), and the parts where the conductive layer 12 is exposed on the substrate 10 are chemically etched to form a wiring pattern 22 (see FIG. 10E).

Patent Document 1
  Japanese Laid-Open Patent Publication No. 2003-188496

Patent Document 2
  Japanese Laid-Open Patent Publication No. 2002-26172

Figure 10A:
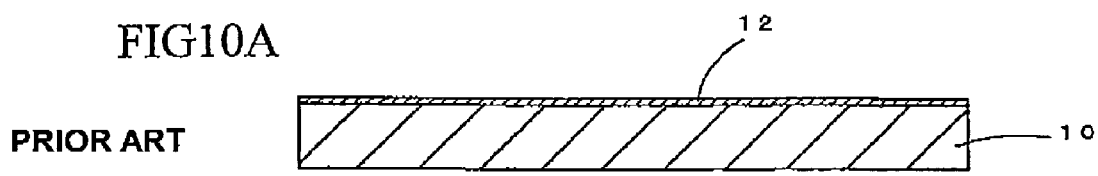
Figure 10B:
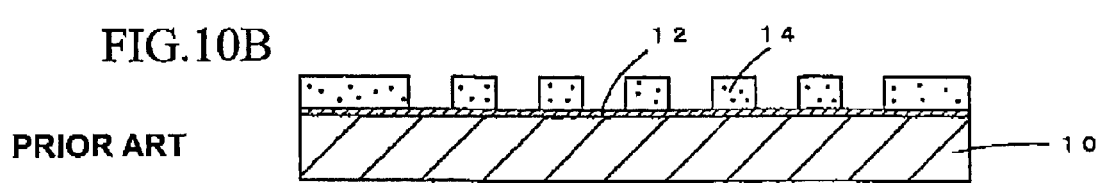
Figure 10C:
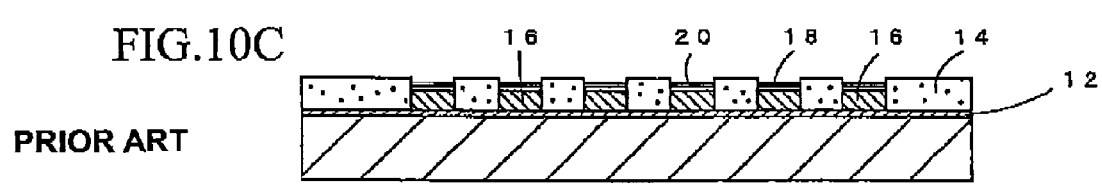
Figure 10D:
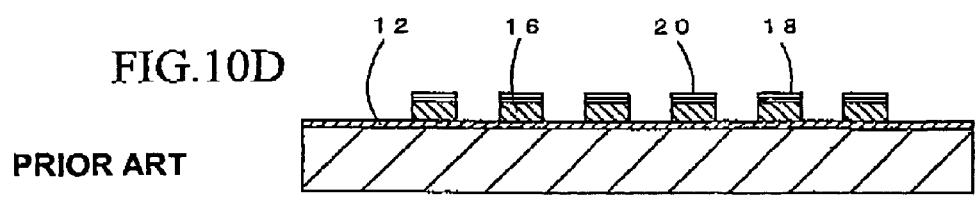
Figure 10E:
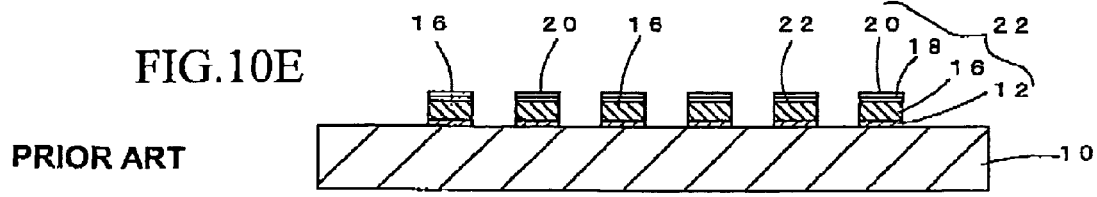

In the semi-additive method, the resist is patterned in accordance with the wiring pattern to be formed on the conductive layer that is formed extremely thinly, and a conductive part that will become the wiring pattern is formed by electroplating, so that it is possible to form a finer wiring pattern compared to the subtract method that forms the wiring pattern by etching a conductive layer formed with a predetermined thickness. However, when the wiring pattern 22 has been formed by the semi-additive method, as shown in FIG. 10E, the copper plating layer 16 becomes exposed at the side surfaces of the wiring pattern 22. Since the wiring pattern 22 formed by the electroplating cannot be exposed in this state, it is necessary to cover the side surfaces of the wiring pattern 22 using a protective film, such as a solder resist.

SUMMARY OF THE INVENTION

It is an object of the present invention to provide a method of manufacturing a printed circuit board that can form a high density wiring pattern without forming bus bars for electroplating and can provide a highly reliable printed circuit board by covering the wiring pattern exposed on the substrate, including the side surfaces of the wiring pattern, with protective plating such as gold plating.

To achieve the object stated above, a method of manufacturing a printed circuit board according to the present invention includes: a step of forming a conductive layer, which is to be used as a plating power supplying layer, on a substrate; a step of forming a first mask pattern for forming a predetermined wiring pattern on a surface of the conductive layer, carrying out electroplating with the conductive layer as the plating power supplying layer to form a conductive part on the conductive layer, and then removing the first mask pattern; a step of forming a second mask pattern that exposes required parts of the conductive part on the substrate, on which the conductive part has been formed on the conductive layer, carrying out electroplating with the conductive layer as the plating power supplying layer to form protective plating on exposed parts of the conductive part, and then removing the second mask pattern; and a step of forming a wiring pattern on the substrate by removing parts of the conductive layer exposed on the substrate, and covering the wiring pattern formed on the substrate, aside from parts on which the protective plating has been formed, with a protective film.

It should be noted that a variety of methods such as a method that uses a dry film and a method that uses a photosensitive resist can be used as the method of forming the first and second mask patterns. Also, to form the protective plating, it is possible to carry out a plating process such as nickel electroplating and gold electroplating.

When forming the second mask pattern so as to expose the required parts of the conductive part, the second mask pattern may be formed so as to expose an upper surface and side surfaces of the conductive part, parts of the conductive layer exposed on the substrate may then be removed, and the protective plating may be formed on outer surfaces of the conductive part and the conductive layer that forms a base of the conductive part by electroplating with the conductive layer as the plating power supplying layer. By forming the protective plating after exposed parts of the conductive layer have been removed with the upper surface and side surfaces of the conductive part in an exposed state, it is possible to apply the protective plating on the outer surfaces including the side surfaces of the conductive part and the conductive layer.

Also, when parts of the conductive layer exposed on the substrate are removed, the parts of the conductive layer that are exposed may be selectively etched using chemical etching. By doing so, the exposed parts of the conductive layer can be removed easily.

Also, it is effective to form a copper plating layer as the conductive part by carrying out copper electroplating with the conductive layer as the plating power supplying layer.

A printed circuit board according to the present invention is a printed circuit board on which protective plating has been carried out as a surface treatment on exposed surfaces of a wiring pattern formed on a surface of a substrate, wherein part of the wiring pattern is formed with an upper surface and side surfaces of a conductive part composing the wiring pattern being exposed on the substrate, and all surfaces of exposed parts of the conductive part including the upper surface and the side surfaces are covered with the protective plating.

The conductive part of the wiring pattern may be made of copper and the protective plating may have a dual layer construction with nickel plating provided as an inner layer and gold plating provided as an outer layer.

According to the method of manufacturing a printed circuit board according to the present invention, using the first mask pattern and the second mask pattern, the conductive part of the wiring pattern is formed by electroplating and the protective plating is formed, so that the conductive part of the wiring pattern formed on the substrate is prevented from being exposed to the outside. This means that corrosion and the like of the conductive part of the wiring pattern are prevented and a reliable printed circuit board can be manufactured. Also, with the printed circuit board according to the present invention, outer surfaces of the wiring pattern exposed on the substrate are covered with the protective plating, so that corrosion of the wiring pattern is prevented and highly reliable products can be provided.

BRIEF DESCRIPTION OF THE DRAWINGS

The aforementioned and other objects and advantages of the present invention will become apparent to those skilled in the art upon reading and understanding the following detailed description with reference to the accompanying drawings.

Figure 2:
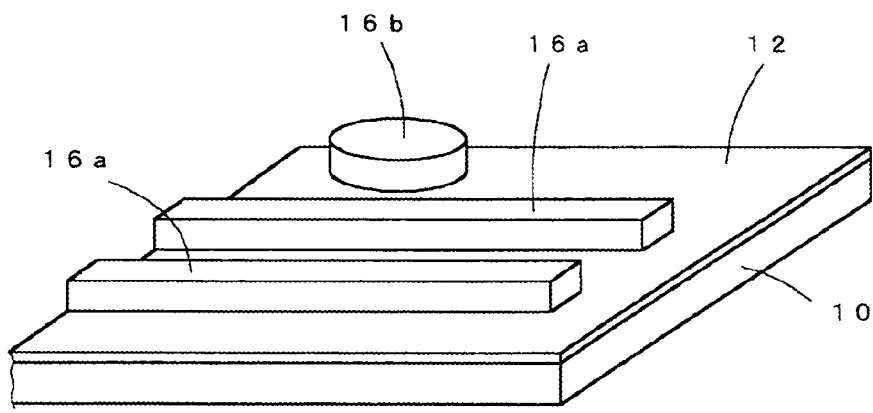
Figure 3:
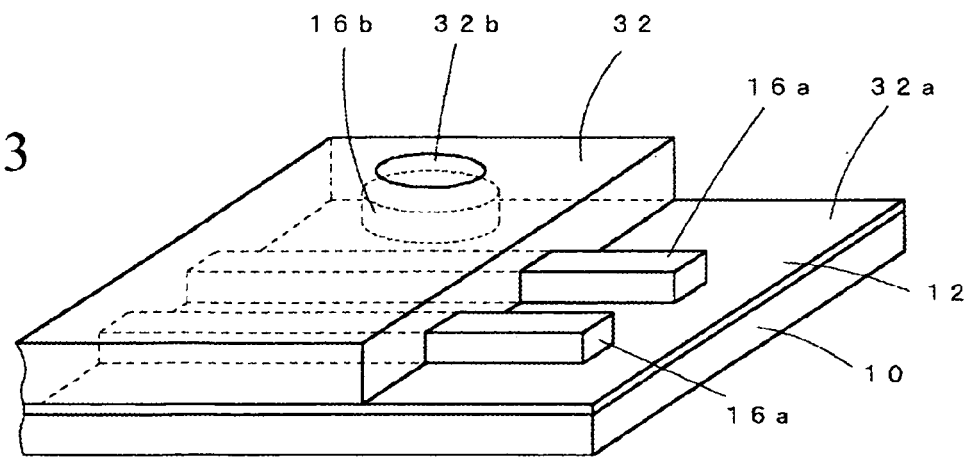
Figure 4:
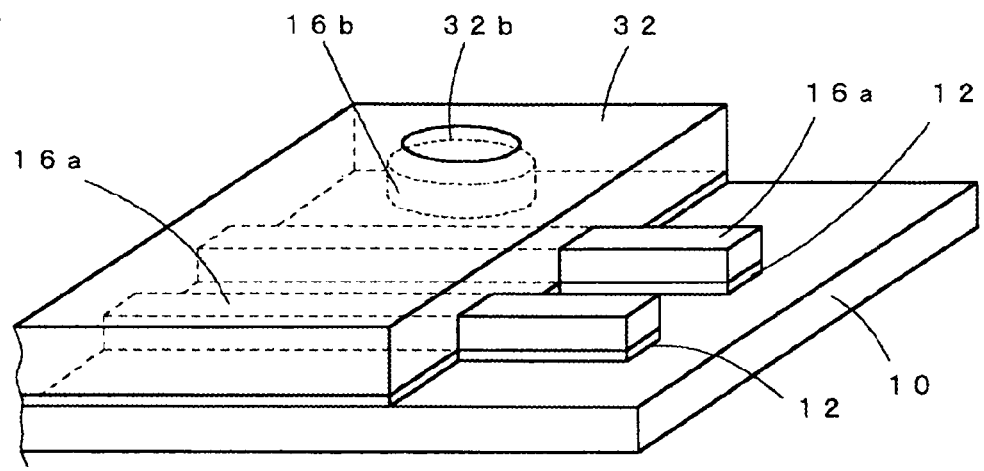
Figure 5:
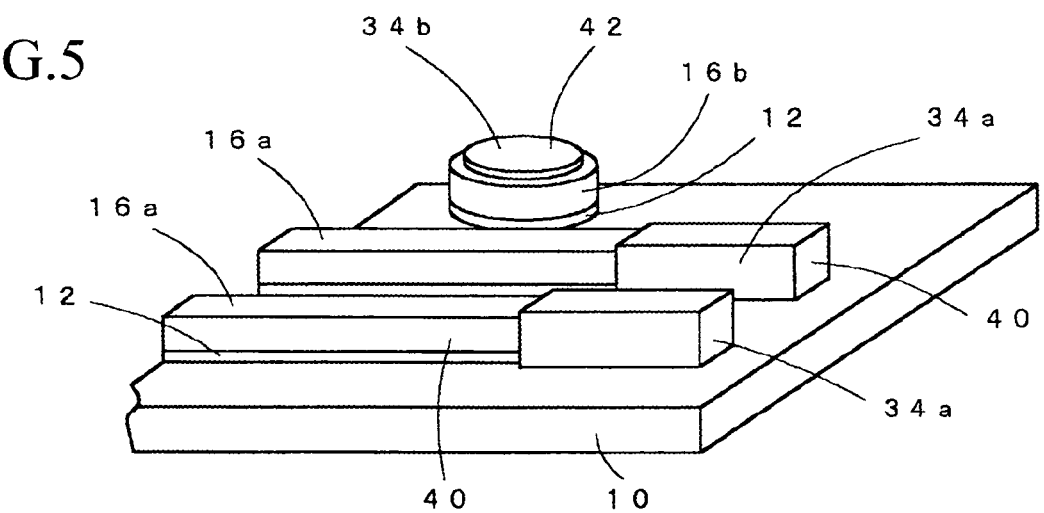
Figure 6:
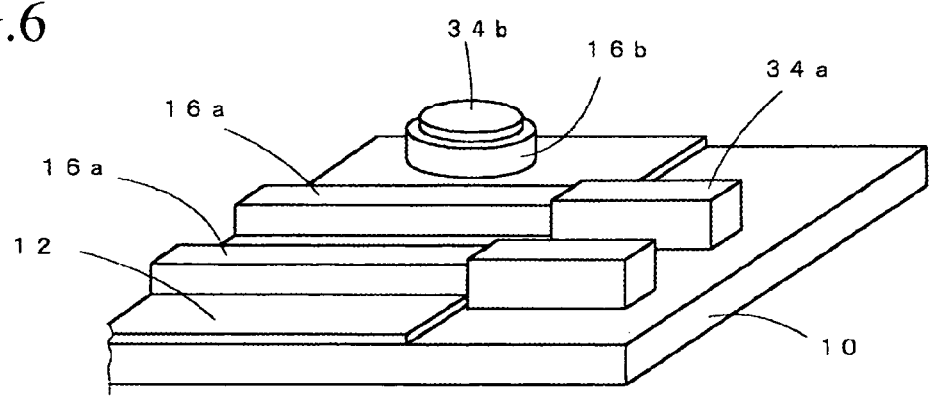
Figure 7:
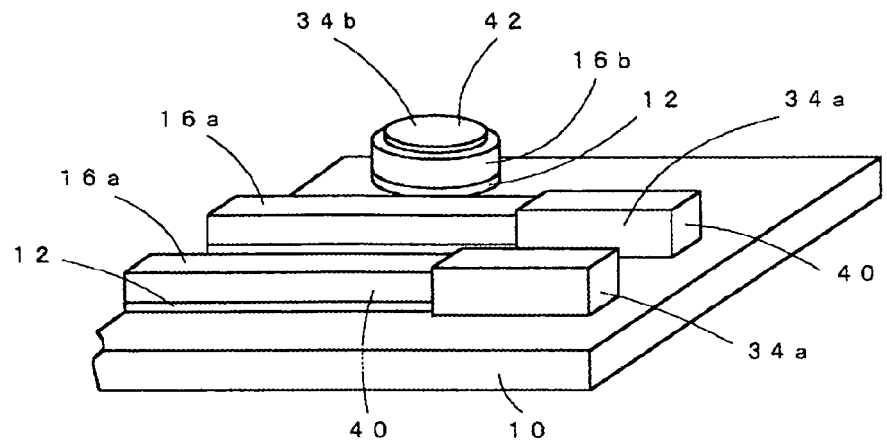
Figure 8:
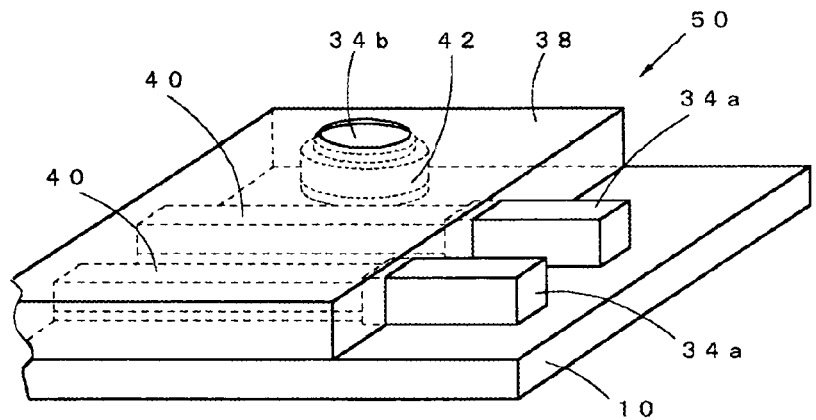
Figure 9:
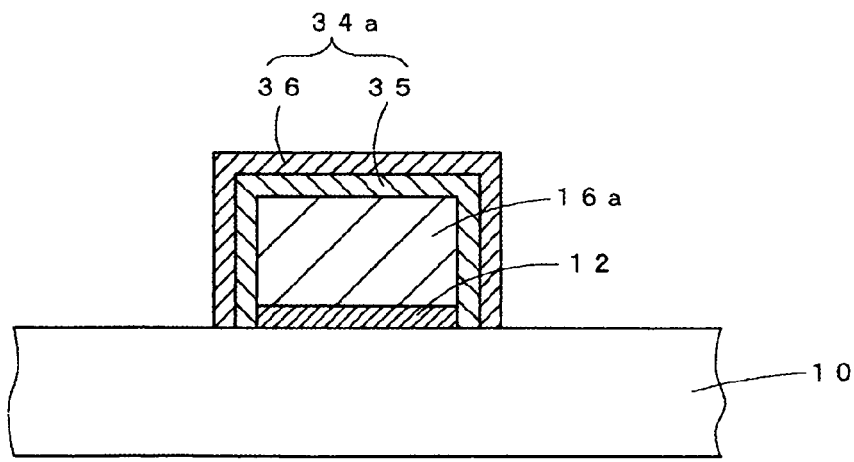

In the drawings:

FIG. 1 is a diagram useful in explaining a method of manufacturing a printed circuit board according to the present invention;

FIG. 2 is a diagram useful in explaining a state where a copper plating layer has been formed on a substrate;

FIG. 3 is a diagram useful in explaining a state where a dry film has been attached to a substrate and exposed and developed;

FIG. 4 is a diagram useful in explaining a state where a conductive layer has been etched;

FIG. 5 is a diagram useful in explaining a state where protective plating has been applied;

FIG. 6 is a diagram useful in explaining a state where the dry film has been removed;

FIG. 7 is a diagram useful in explaining a state where the conductive layer has been etched;

FIG. 8 is a diagram useful in explaining a state where the protective film has been provided;

FIG. 9 is a cross-sectional view showing the structure of the protective plating provided on the wiring pattern; and FIGS. 10A to 10E are diagrams useful in explaining a semi-additive method of forming a wiring pattern.

DESCRIPTION OF THE PREFERRED EMBODIMENTS

FIGS. 1 to 9 are diagrams useful in explaining a method of manufacturing a printed circuit board according to the present invention. The following describes the method in order of the manufacturing steps.

FIG. 1 shows a state where a conductive layer 12 has been formed on the surface of a substrate 10, a photosensitive dry film 30 has been laminated on the surface of the conductive layer 12, and the dry film 30 has been exposed and developed.

It should be noted that the conductive layer 12 is used as the plating power supplying layer when a wiring pattern is formed by electroplating and can be formed by electroless copper plating or sputtering. Since parts that are not needed are removed by chemical etching in a later process, to facilitate such removal by etching, the conductive layer 12 is formed thinly but thick enough to conduct electricity (with a thickness of around 1 μm or below).

The dry film 30 is exposed and developed in accordance with the wiring pattern to be formed on the substrate 10 and concaves 30a, 30b where the conductive layer 12 is exposed at bottom surfaces thereof are formed at parts where the wiring pattern will be formed. FIG. 1 is useful in explaining how the dry film 30 is patterned as a first master pattern. In FIG. 1, the concaves 30a correspond to leader lines in the wiring pattern and the concave 30b corresponds to an island-like part that is to be separately formed in the wiring pattern on the substrate 10.

Next, electroplating is carried out with the conductive layer 12 as the plating power supplying layer to form copper plating layers 16a, 16b that build up inside the concaves 30a, 30b. FIG. 2 shows a state where the copper plating layers 16a, 16b have been formed in the concaves 30a, 30b and the dry film 30 has been separated and removed. By removing the dry film 30, copper plating layers 16a, 16b that have been thickly formed are formed in a predetermined pattern on the surface of the conductive layer 12.

In the conventional semi-additive method, after the copper plating layer has been formed, protective plating, such as gold plating, is carried out, but in the present embodiment, only the copper plating layers 16a and 16b are formed.

Next, as shown in FIG. 3, a separate dry film 32 is newly laminated on the surface of the substrate 10 on which the copper plating layers 16a, 16b are formed, and the dry film 32 is exposed and developed. FIG. 3 shows a state where the dry film 32 has been patterned as a second master pattern. In FIG. 3, reference numeral 32a designates a region where the dry film 32 has been etched to partially expose the copper plating layers 16a for the leader line parts and expose the conductive layer 12 that is the base, and reference numeral 32b designates a region where the surface of the copper plating layer 16b has been exposed. The dry film 32 can also be exposed and developed as desired to cover a surface of the substrate 10 in a predetermined pattern.

Next, the substrate 10 is chemically etched to remove parts of the conductive layer 12 exposed on the substrate 10 in the state shown in FIG. 3. FIG. 4 shows the state where the conductive layer 12 exposed on the substrate 10 has been removed.

When the conductive layer 12 is etched by chemical etching, there is the possibility of the etching liquid also soaking into parts of the copper plating layers 16a, 16b exposed on the substrate 10, but since the conductive layer 12 is much thinner than the copper plating layers 16a, 16b, the copper plating layers 16a, 16b are hardly affected when the conductive layer 12 is etched and removed. This etching operation leaves, on the substrate 10, the conductive layer 12 in a region, aside from the copper plating layer 16b, that is covered by the dry film 32 and the conductive layer 12 in parts that are the bases of the copper plating layers 16a in the region 32a.

Next, electro nickel plating and electro gold plating are carried out with the conductive layer 12 as the plating power supplying layer to form protective plating on the copper plating layers 16a, 16b. FIG. 5 shows a state where electro nickel plating and electro gold plating have been carried out so that the surfaces of the copper plating layers 16a, 16b have been covered with protective layers 34a, 34b.

In the process that forms the protective layers 34a, 34b, the copper plating layers 16a, 16b are not covered by the dry film 32 and parts that are exposed to the outside are covered with the protective layers 34a, 34b. Since the conductive layer 12 remains as a base layer at the parts where the copper plating layers 16a, 16b have been formed, it is possible to form the protective layers 34a, 34b at exposed parts of the copper plating layers 16a, 16b by electroplating.

FIG. 9 shows a state where the protective plating 34a has been formed on a copper plating layer 16a when looking from a cross-sectional direction of the copper plating layer 16a. By carrying out electro nickel plating and electro gold plating, dual-layer protective plating 34a composed of an inner nickel plating layer 35 and an outer gold plating layer 36 is provided so as to surround the side and upper surfaces of the copper plating layers 16a and the conductive layer 12.

The end surfaces of the copper plating layers 16a are also covered with the nickel plating layer 35 and the gold plating layer 36 so that the parts of the copper plating layer 16a shown in FIG. 4 exposed to the outside are completely covered by the protective plating 34a.

Next, the dry film 32 that covers the substrate 10 is separated and removed (see FIG. 6). When the dry film 32 is removed, the conductive layer 12 becomes exposed on the substrate 10. The copper plating layer 16b is formed as an island by forming the copper plating layer 16b on the conductive layer 12 and covering the upper surface of the copper plating layer 16b with the protective plating 34b.

Next, the conductive layer 12 exposed on the substrate 10 is removed by chemical etching (see FIG. 7). Since the conductive layer 12 is much thinner than the copper plating layers 16a, 16b, the operation that etches and removes the conductive layer 12 selectively removes the parts of the conductive layer 12 exposed on the substrate 10 without affecting the copper plating layers 16a, 16b and the protective plating 34a, 34b.

By doing so, wiring patterns 40, 42 are formed on the substrate 10 as independent patterns. The wiring patterns 40 are formed as leader lines and the wiring pattern 42 is formed as a separate island.

FIG. 8 shows a final state where the printed circuit board 50, on which the wiring patterns 40, 42 formed on the substrate 10 are covered by a solder resist 38 as a protective film, has been manufactured. By using a solder resist 38 that is photosensitive and exposing and developing the solder resist 38 in a predetermined pattern, it is possible to cover the surface of the substrate 10 with the solder resist 38 so as to expose predetermined regions.

In the illustrated example, the solder resist 38 is provided so as to expose ends of the wiring patterns 40 that are covered with the protective plating 34a and an inner part of a region of the wiring pattern 42 covered with the protective plating 34b, and to cover other parts of the wiring patterns 40, 42. In this way, the only parts where the printed circuit board 50 is exposed to the outside are parts that are covered by the protective plating 34a, 34b.

In the printed circuit board 50 shown in FIG. 8, all outer surfaces of the wiring patterns 40 disposed in the region of the substrate 10 not covered by the solder resist 38 (here, the outer surfaces include the side surfaces of the copper plating layers 16a that are the conductive parts of the wiring patterns 40 and side surfaces of the conductive layer 12 that is the base layer of the copper plating layers 16a) are entirely covered with the protective plating 34a, so that it is possible to provide a highly reliable printed circuit board for which there is no corrosion of exposed parts of the wiring patterns 40. The construction of the present embodiment can be used effectively for printed circuit boards where connecting electrodes are exposed on a substrate.

In the same way as the semi-additive method, the method of manufacturing a printed circuit board according to the present embodiment forms the conductive layer 12 thinly on the substrate 10 and then forms the wiring patterns 40, 42, so that the wiring patterns 40, 42 can be formed more finely compared to the subtract method.

In addition, by using the semi-additive method, bus bars for electroplating do not need to be disposed even when forming wiring patterns as separate islands, which also makes it possible to dispose wiring patterns at high density.

What is claimed is:

1. A method of manufacturing a printed circuit board, comprising:

forming a conductive layer, which is to be used as a plating power supplying layer, on a substrate;

forming a first mask pattern for forming a predetermined wiring pattern on a surface of the conductive layer, carrying out electroplating with the conductive layer as the plating power supplying layer to form a conductive part on the conductive layer, and then removing the first mask pattern;

forming a second mask pattern that exposes required parts of the conductive part on the substrate, on which the conductive part has been formed on the conductive layer, carrying out electroplating with the conductive layer as the plating power supplying layer to form protective plating on all exposed parts of the conductive part, and then removing the second mask pattern; and forming a wiring pattern on the substrate by removing parts of the conductive layer exposed on the substrate, and covering the wiring pattern formed on the substrate, aside from parts on which the protective plating has been formed, with a protective film, and the forming the second mask pattern comprises forming the second mask pattern so as to expose the required parts of the conductive part, the second mask pattern is formed so as to expose an upper surface and side surfaces of the conductive part, parts of the conductive layer exposed on the substrate are then removed, and the protective plating is formed on all outer surfaces of the conductive part and the conductive layer that forms a base of the conductive part by electroplating with the conductive layer as the plating power supplying layer.

2. A method of manufacturing a printed circuit board according to claim 1, wherein when parts of the conductive layer exposed on the substrate are removed, the parts of the conductive layer that are exposed are selectively etched using chemical etching.

3. A method of manufacturing a printed circuit board according to claim 1, wherein copper electroplating is carried out with the conductive layer as the plating power supplying layer to form a copper plating layer as the conductive part.

4. The method of manufacturing a printed circuit board according to claim 1, the forming the second mask pattern further comprising covering all outer surfaces of the wiring pattern in the region of the substrate not covered by the protective film.

5. The method of manufacturing a printed circuit board according to claim 4, the covering all outer surfaces comprising covering side surfaces of the conductive part and side surfaces of the conductive layer.

6. The method of manufacturing a printed circuit board according to claim 4, the protective film being a solder resist.

7. A method of manufacturing a printed circuit board, comprising:

forming a conductive layer on a substrate;

forming a first mask pattern for forming a wiring pattern on a surface of the conductive layer, carrying out electroplating with the conductive layer as the plating power supplying layer to form a conductive part on the conductive layer, and removing the first mask pattern;

forming a second mask pattern that exposes parts of the conductive part on the substrate, carrying out electroplating with the conductive layer as the plating power supplying layer to form protective plating on all the exposed parts of the conductive part, and removing the second mask pattern;

forming a wiring pattern on the substrate by removing parts of the conductive layer exposed on the substrate and covering the wiring pattern formed on the substrate, aside from parts on which the protective plating has been formed, with a protective film and so all outer surfaces of the wiring pattern in a region of the substrate not covered by the protective film are covered by the protective plating.

* * * * *